(12) United States Patent
Zheng et al.

(10) Patent No.: US 11,349,068 B2
(45) Date of Patent: May 31, 2022

(54) MEMORY CELLS

(71) Applicant: Intel Corporation, Santa Clara, CA (US)

(72) Inventors: Pengyuan Zheng, Boise, ID (US); Stephen W. Russell, Boise, ID (US); David R. Economy, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/292,180

(22) Filed: Mar. 4, 2019

(65) Prior Publication Data

US 2019/0198756 A1    Jun. 27, 2019

(51) Int. Cl.
*H01L 29/00* (2006.01)
*H01L 45/00* (2006.01)
*H01L 27/24* (2006.01)

(52) U.S. Cl.
CPC .......... *H01L 45/06* (2013.01); *H01L 27/2409* (2013.01); *H01L 45/1253* (2013.01); *H01L 45/144* (2013.01); *H01L 45/1608* (2013.01); *H01L 45/1675* (2013.01)

(58) Field of Classification Search
CPC ... H01L 45/06; H01L 45/1253; H01L 45/144; H01L 45/1608; H01L 45/1675; H01L 27/2409
See application file for complete search history.

(56) References Cited

U.S. PATENT DOCUMENTS

| | | | |
|---|---|---|---|
| 9,054,295 B2 | 6/2015 | Gotti et al. | |
| 9,299,747 B1 | 3/2016 | Pellizzer et al. | |
| 9,299,929 B2 | 3/2016 | Gotti et al. | |
| 9,608,042 B2 | 3/2017 | Pellizzer et al. | |
| 10,658,297 B2 | 5/2020 | Redaelli et al. | |
| 2019/0140022 A1* | 5/2019 | Jeong | H01L 45/04 |
| 2019/0172871 A1* | 6/2019 | Yang | H01F 10/3254 |
| 2020/0005863 A1* | 1/2020 | Grobis | G11C 13/0069 |

OTHER PUBLICATIONS

Kurt et al., "Electrical and structural properties of carbon-nitrogen films", Mat. Res. Soc. Symp. Proc., vol. 593, p. 511-516. (Year: 2000).*

Hellgren et al., "Anisotropies in magnetron sputtered carbon nitride thin films", APL, vol. 78, No. 18, p. 27032705. (Year: 2001).*

Zhang et al., "Phases and physical properties of carbon nitride thin films prepared by pulsed laser deposition", Mat. Sci. and Eng., A209, p. 5-9 (Year: 1996).*

* cited by examiner

*Primary Examiner* — Meiya Li
(74) *Attorney, Agent, or Firm* — Alliance IP, LLC

(57) ABSTRACT

A memory cell can include a phase change material layer and a first electrode layer adjacent to the phase change material layer and having a phase change material layer side oriented toward the phase change material layer and a bit line side opposite the phase change material layer side. A carbon nitride layer can be on the bit line side surface of the first electrode layer. In some examples, a nonconductive separator material can have a word line end and a bit line end, and can have a portion contacting the phase change material layer. The bit line end surface of the nonconductive separator material can be at least partially free of contact with the carbon nitride layer.

18 Claims, 13 Drawing Sheets

MEMORY CELLS

BACKGROUND

Phase change materials have properties that invite their use in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store information. Each state can be designated a different value, and once stored, information can be read by detecting the electrical resistance of the material. The fact that each state persists once fixed makes PCM a valuable non-volatile memory (NVM) type.

DESCRIPTION OF EMBODIMENTS

Figure 1:
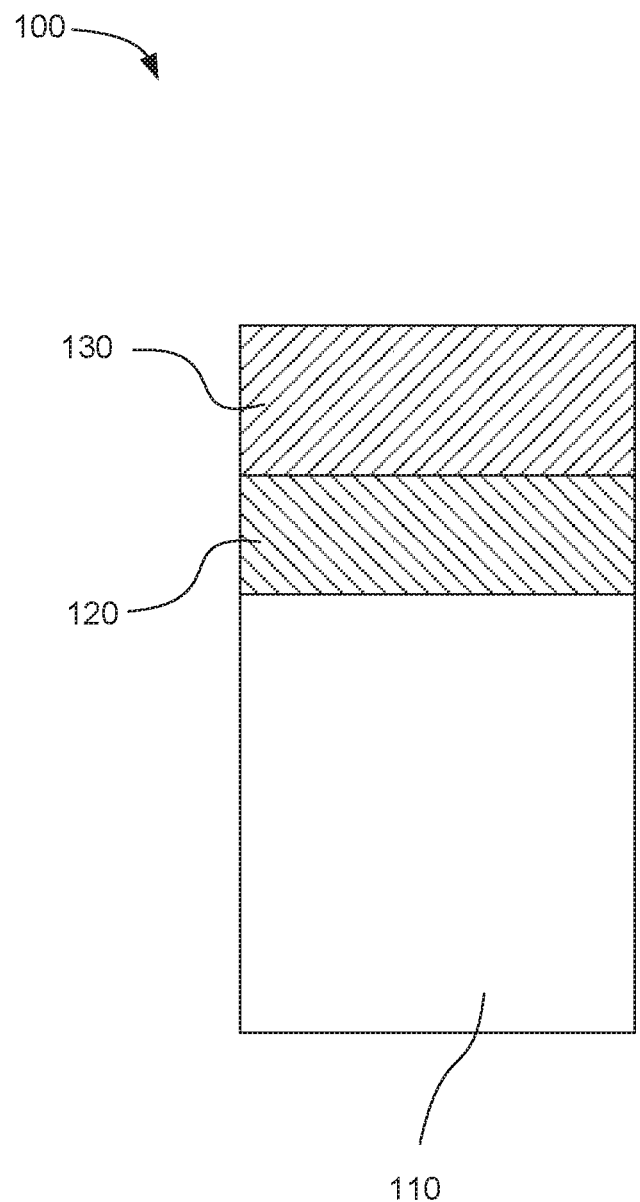
FIG. 1 is a cross-sectional view of an example memory cell in accordance with an example embodiment.

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions or orientation. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies to both the form and function of individual components in a device or process, as well as to such devices or processes as a whole.

As used herein, "coupled" refers to a relationship of physical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

Phase change memory arrays have been developed to include many memory cells connected to bit lines and word lines. In many cases, each phase change memory cell is made up of a number of layers of different materials. One of the layers is typically a phase change material, while other layers can include electrodes, select device materials, diffusion barrier materials, thermal insulating materials, and so on. In some cases, individual memory cells can be separated by dielectric materials to electrically insulate the memory cells one from another. Bit lines and word lines can be a line of metal deposited along columns and rows of memory cells to allow the memory cells to be individually addressable. Additional structures are sometimes incorporated into the memory array such as conductive vias that penetrate through the substrate on which the memory array is formed.

The various material layers and structures that make up a phase change memory array can present various manufacturing challenges. It can be desirable to make these structures as small as possible in order to make high-density memory. However, this is balanced against processing limitations and the need for consistent and reliable memory operation. In certain types of phase change memory, the memory cells can include at least a phase change material layer and a first electrode layer above the phase change material layer. A metal bit line can be deposited over a column of memory cells.

In certain examples, an electrically resistive material can be placed between the first electrode layer and the metal bit line. In some cases, the resistive material layer can enhance the operation of the phase change memory cells by benefitting the programming current of the memory cells. In some processes, a metal silicon nitride material is used as this resistive material layer.

Some processes for manufacturing this type of phase change memory can included the following steps. First, continuous layers of phase change material and first electrode material can be deposited. Then these layers can be divided into individual memory cells separated by dielectric material, or alternatively the layers can be divided into multiple lines separated by dielectric material that can subsequently be cut into individual memory cells. A layer of metal silicon nitride can then be deposited over the top of the first electrodes and the dielectric material. A metal bit line can be deposited over the metal silicon nitride layer. This results in a memory structure having a continuous layer of metal silicon nitride that extends along the top surfaces of the dielectric material and first electrodes of a column of memory cells.

Layers of the various materials can be deposited by methods such as chemical vapor deposition (CVD), physical vapor deposition (PVD) spin coating/spin-on deposition (SOD), electron beam evaporation, and others. In some cases the layers can be patterned using methods such as lithography techniques including wet etch, dry etch, and other patterning methods. In some cases, a temporary layer such as a mask or a protective cap can be deposited and then subsequently removed by a polishing operation, such as chemical mechanical polishing (CMP).

In the phase change memory manufacturing method described above, a vertical conductive via can be added either before or after the memory cells are divided and separated by dielectric material. The conductive via can be formed from a metal such as tungsten. In some cases, a temporary nitride layer can be deposited over the memory cells while forming the via. After the via is formed, the nitride layer can be removed by a chemical mechanical polishing operation. A metal silicon nitride layer can then be deposited over the first electrodes of the memory cells and the dielectric material between the cells. The metal silicon nitride layer is also deposited over the via. A metal bit line can then be deposited over the metal silicon nitride layer.

One issue with this process is related to performing a chemical mechanical polishing operation that stops at the surface of the first electrodes of the memory cells. In some cases, the first electrodes are made of a relatively soft material, such as a carbon-based material. The chemical mechanical processing operation can wear away some of the first electrode material. In some cases, the first electrodes can wear away more in certain locations than at others, such as wearing more near the edges and less near the center, resulting in non-uniformity that can negatively affect subsequent processes such as subsequent etch operations. This non-uniformity can change etch profiles and cause, for example, under-etching, over-etching, or more lateral etch than desired. This can potentially expose the cell stack and negatively impact cell yield. In some cases, these issues can result in cross-contamination of select device materials and phase change materials.

The chemical mechanical processing operation can also cause "dishing," or in other words having a curved depression in the surface of the dielectric material. This dishing can negatively affect the operation of the memory cell. In some cases, the memory cell can be inoperable, which negatively affects cell yield.

Additionally, the process described above results in a metal silicon nitride layer between the bit line and the via. In some cases the via and the bit line are made of the same metal, such as tungsten. Including a metal silicon nitride layer, such as tungsten silicon nitride, between the bit line and the via can increase electrical resistance between the bit line and the via compared to a direct metal-to-metal contact between the bit line and the via. However, it can be desirable to include the metal silicon nitride layer to connect the first electrodes to the bit line as mentioned above. The process also results in a via that protrudes toward the bit line. Thus, when the metal silicon nitride layer and the bit line are deposited, they wrap around the protruding via. The deposition of the metal silicon nitride layer further adds to the via protrusion. In some cases the via protrudes to the point that the bit line deposited over the via can break in the vicinity of the via.

The present technology encompasses processes for manufacturing phase change memory structures. Such processes can address many of the above-described issues. In one example, a phase change memory structure can be made with a column of memory cells electrically connected by a bit line and a vertical via also connected to the bit line. However, a continuous layer of a carbon nitride material can be deposited at the beginning of the process before the memory cells are divided. For example, a stack of layers of material can be deposited, including a continuous layer of phase change material and a continuous layer of first electrode material. A continuous layer of carbon nitride can be deposited over the first electrode material at this stage.

The carbon nitride material referred to herein can be a solid compound and/or mixture of carbon and nitrogen. As used herein, "carbon nitride" is not limited to any particular stoichiometry or proportion of carbon to nitrogen. In some examples, the carbon nitride can comprise 23 at. % to 40 at % nitrogen and 60 at. % to 77 at. % carbon. In further examples, the carbon nitride can consist of or consist essentially of 23 at. % to 40 at. % nitrogen and 60 at. % to 77 at. % carbon. The carbon nitride layer can be deposited by any suitable process, such as PVD or CVD.

After the continuous layers of phase change memory materials are deposited (including the carbon nitride layer over the first electrode layer), the layers can be divided into individual memory cells and vias can be formed as described above. Alternatively, the layers can be divided into multiple lines that can subsequently be divided into individual memory cells. Adding the carbon nitride layer in the early stages of the process can produce several advantages. First, the carbon nitride layer can protect the first electrode layer of the memory cells during chemical mechanical polishing processes. The process of dividing the memory cells and forming the via can involve depositing nitride mask layers and then subsequently removing the nitride layers by chemical mechanical polishing. In some examples, the chemical mechanical polishing operation can stop on the carbon nitride layer. Thus, the first electrode layer is not worn down by the chemical mechanical polishing operation.

Additionally, because the carbon nitride layer is deposited before the memory cells are divided into individual memory cells, the carbon nitride layer is discontinuous and does not cover the top of the via. In particular, a portion of the carbon nitride layer can be removed in the location where the via is formed. When the metal bit line is deposited at the end of the process, the metal bit line directly contacts the via by a metal-to-metal contact. This can have reduced resistance compared to the previous process in which a metal silicon nitride layer is between the metal bit line and the via.

In certain examples, the via may not protrude past the surface of the material layer stack. However, in some examples the via may protrude to a certain extent due to differences between the removal rate of the metal forming the via and the other materials during polishing operations.

Making memory devices using the herein-recited processes can result in memory devices having a unique structure. In particular, the individual memory cells in the memory devices can include a layer of carbon nitride on the bit line side surface of the first electrode layer. The memory cells can be separated one from another by a nonconductive separator material. The carbon nitride layer can be discontinuous so that the carbon nitride layer is present over the first electrode layers of the memory cells, but the carbon nitride layer is not over the nonconductive separator material between the memory cells. Furthermore, both the memory cells and the nonconductive separator material can be entirely free of metal silicon nitride, unlike in the previous process.

The present processes can also provide first electrode layers that have a more uniform upper surface. No erosion of the first electrode layers occurs because the chemical mechanical polishing process does not proceed down to the upper surface of the first electrode layers.

In further examples, the carbon nitride layer can provide a useful thermal barrier. In some examples, the carbon nitride material can have a density of about 2 g/cm$^3$ to about 3 g/cm$^3$, or from about 2.2 g/cm$^3$ to about 2.5 g/cm$^3$. The thermal conductivity of the material can be from about 0.2 W/m·K to about 2 W/m·K. The phase change material layer of the memory cells can reach high temperatures during operation of the memory device. The carbon nitride layer can reduce heat transfer from the phase change material layer to the metal bit line in some examples.

The resistivity of the carbon nitride layer can vary depending on the ratio of carbon and nitrogen in the layer. The resistivity can also be a function of temperature. As mentioned above, the phase change material in the phase change memory cells can be heated to high temperatures at some times during operation of the memory device. Additionally, the temperature of the phase change material may vary depending on whether a memory cell is being written to or being read. The resistivity of the carbon nitride layer can be tuned by adjusting the ratio of carbon and nitrogen until the resistivity of the carbon nitride is suitable at the temperatures reached during operation of the memory device. In some examples, the resistivity of the carbon nitride layer can be from about 0.1 ohm-cm to about 2 ohm-cm at 20° C. In further examples, the resistivity can be from about 0.5 to about 1.1 ohm-cm at 20° C. In still further examples, the resistivity can be from about 0.01 ohm-cm to about 0.05 ohm-cm at 600° C., or from about 0.015 ohm-cm to about 0.025 ohm-cm at 600° C.

In certain examples, the memory cells can be manufactured by depositing layers of material in sequence starting with a bottom layer and working upward. In some such processes, the memory cell can be oriented with the third electrode layer at the bottom and the carbon nitride layer at the top. Accordingly, in some cases the third electrode layer can be referred to as a bottom electrode layer. Similarly, the first electrode layer can in some cases be referred to as the top electrode layer. The second electrode layer can also be referred to as the middle electrode layer. It is understood that the memory devices described herein can be oriented in a variety of orientations and that the "top electrode" may not literally be at the top of the device in all circumstances. However, for convenience these terms can be used to describe the various layers and parts of the memory cells and memory devices. Additionally, terms denoting locations and directions such as "above," "below," "down", "downward," "up," "upward," "higher," "lower," and so on can be interpreted consistent with the top and bottom of the memory cells as described above. Further, because a metal bit line is deposited in contact with the carbon nitride layer at the "top" of the memory cells, in some cases the terms "bit line side" or "bit line end" can refer to a surface of a layer that is closest to the bit line. The direction "up" or "upward" can also be referred to as "bit line oriented" or "bit line end direction." The word lines can be located opposite from the bit lines, in contact with the third, or "bottom," electrode layers. Therefore, the terms "word line side," "word line end," "word line oriented," and "word line end direction" can be used to refer to surfaces closest to the word line, the direction toward the word line, or in other words the "downward" direction or "bottom" surfaces With this description in mind, FIG. 1 shows a cross-sectional view of an example memory cell 100 according to the present technology. This memory cell includes a phase change material layer 110 and a first electrode layer 120 adjacent to the phase change material layer. The first electrode layer has a phase change material layer side oriented toward the phase change material layer and a bit line side opposite the phase change material layer side. A carbon nitride layer 130 is on the bit line side surface of the first electrode layer. As mentioned above, the carbon nitride layer can have resistivity that provides a programming current benefit when the memory cell is operating.

Figure 2:
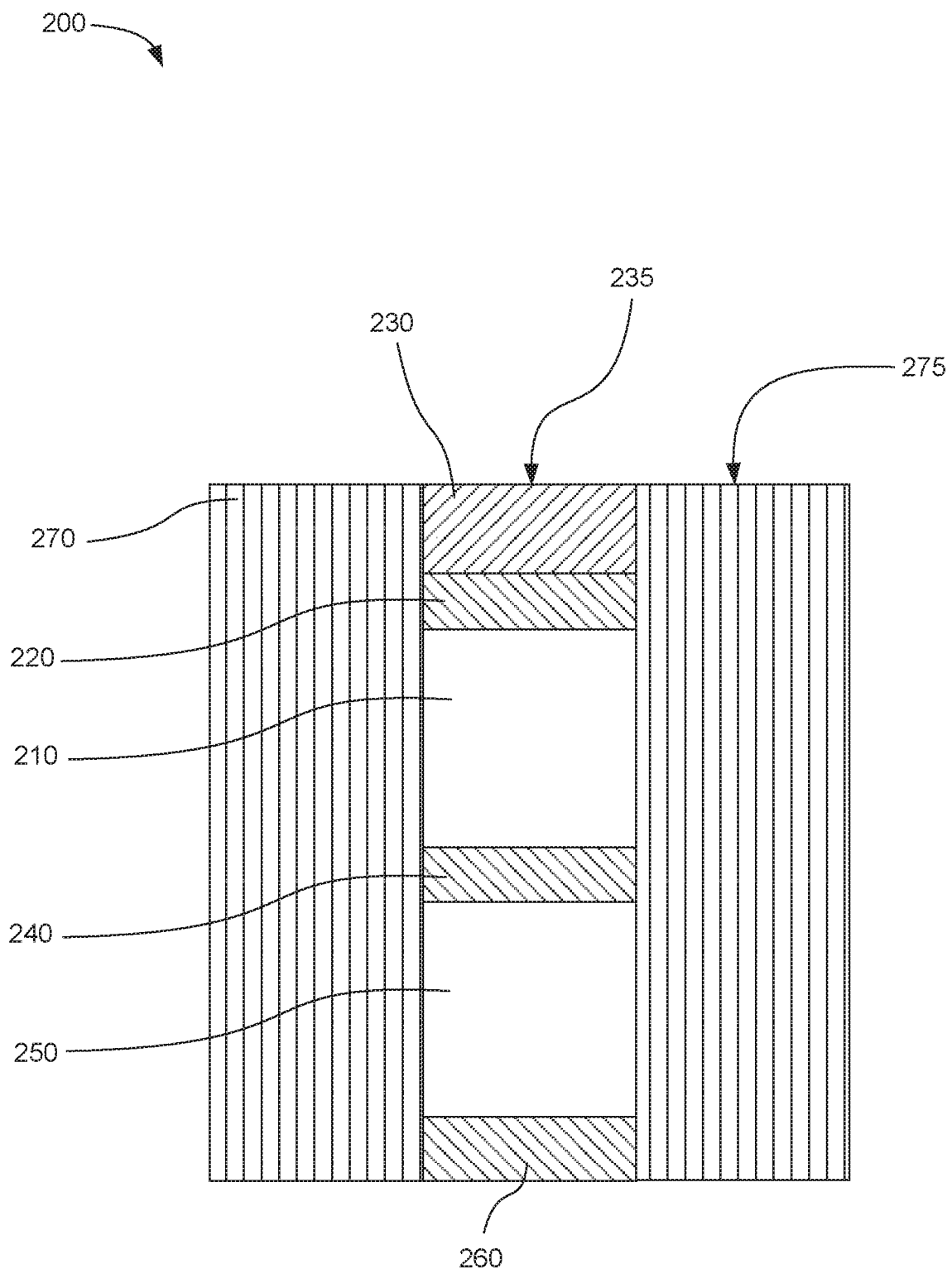
FIG. 2 is a cross-sectional view of another example memory cell in accordance with an example embodiment.

Another example memory cell 200 is shown in FIG. 2. This example also includes a phase change material layer 210, a first electrode layer 220, and a carbon nitride layer 230. In addition to these layers, the memory cell includes a second electrode layer 240 adjacent the phase change material layer on a side opposite the first electrode layer, a select device material layer 250 adjacent the second electrode layer on a side opposite the phase change material layer, and a third electrode layer 260 adjacent the select device material layer on a side opposite the second electrode layer. A nonconductive separator material 270 contacts sides of the memory cell. In this example, the nonconductive separator material contacts sides of the phase change material layer and each of the other layers in the memory cell. The nonconductive separator material can electrically insulate the memory cell from other memory cells in a memory cell array. Additionally, the nonconductive separator material can have a word line end and a bit line end, and the bit line end surface 275 can be coplanar with the bit line side surface 235 of the carbon nitride layer.

The thicknesses of the layers are not particularly limited. However, in some examples the carbon nitride layer can have a thickness of about 10 Å to about 300 Å. In further examples, the carbon nitride layer can have a thickness of about 20 Å to about 100 Å. In a particular example, the carbon nitride layer can be about 50 Å thick. In other examples, the first electrode layer can have a thickness of about 10 Å to about 500 Å. In further examples, the first electrode layer can have a thickness of about 20 Å to about 200 Å. It should be noted that the layer thicknesses, lengths, and widths shown in the figures are not necessarily drawn to scale.

In some examples, the first electrode can have a top surface that is substantially flat. This is an improvement over the previous process, which can result in erosion of the first electrodes. In some examples, the substantially flat first electrode can have a height variation of 20 Å or less, 10 Å or less, or even 2 Å or less.

In certain examples, the memory cells described herein can include additional layers. These additional layers can include, but are not limited to, additional electrode layers, diffusion barrier layers, select device material layers, conductive word line layers, and so on.

As a general matter, the phase change material can include any useful material having a stable and detectable change in phase. Examples of such a materials include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_xSb_yTe_z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient.

It is noted that the select device material can generally be made of a phase change material, and as such, the above exemplary chalcogenide materials are applicable to select device material layers as well. The actual chalcogenide material used in a given memory cell for the phase change material layer and the select device material layer can be different or the same, depending on the design of the device. In another example, the select device material can be a conductor, semiconductor, or dielectric material. Such materials can be selected as needed to perform an intended function in the memory cell.

The first electrode layer and/or other electrode layers in the memory cell can be formed of conductive materials. In some examples, the electrode layers can include carbon-containing materials. Specific, non-limiting examples of electrode materials can include amorphous carbon, amorphous carbon doped with silicon, and silicon carbide doped with tungsten.

The memory cell can include a nonconductive separator material with a portion contacting the phase change material layer. In various examples, the nonconductive separator material may contact one side, two sides, three sides, four sides, etc. of the phase change material layer. The nonconductive separator material can also extend toward the bit line and/or toward the word line so that the nonconductive separator material contacts other layers in the memory cell, such as the electrode layers, the carbon nitride layer, the select device material layer, and so on. Generally, the nonconductive separator material can insulate the memory cell from other adjacent memory cells. In certain examples, memory cells can be insulated one from another by a combination of nonconductive separator material and air gaps or other materials.

In some examples, the nonconductive separator material can be a spin-on dielectric material. In a particular example, the nonconductive separator material can be a silicon dioxide dielectric material. In another particular example, the nonconductive separator material can include or be formed from tetraethyl orthosilicate (TEOS).

The bit line end surface of the nonconductive separator material can be at least partially free of contact with the carbon nitride layer. In certain examples, the memory cell can be formed by depositing continuous layers of the memory cell materials, with the top layer being the carbon nitride layer. The layers can then be divided into memory cells by etching to remove the layer materials between the memory cells. Thus, the carbon nitride is removed from between memory cells. A nonconductive separator material can then be filled in the spaces between memory cells. Therefore, the nonconductive separator material does not have carbon nitride deposited on the bit line end surface of the nonconductive separator material. This is different from the prior process, in which a continuous layer of metal silicon nitride was deposited after the memory cells had already been divided. In some examples, the bit line end surface of the nonconductive separator material can be entirely free of contact with the carbon nitride. However, because some small amount of carbon nitride may potentially overlap the bit line end surface of the nonconductive separator material (either by diffusion, contamination, or some other imperfection), in some examples, the bit line end surface of the nonconductive separator material can be substantially free of contact with the carbon nitride or at least partially free of contact with the carbon nitride.

Figure 3:
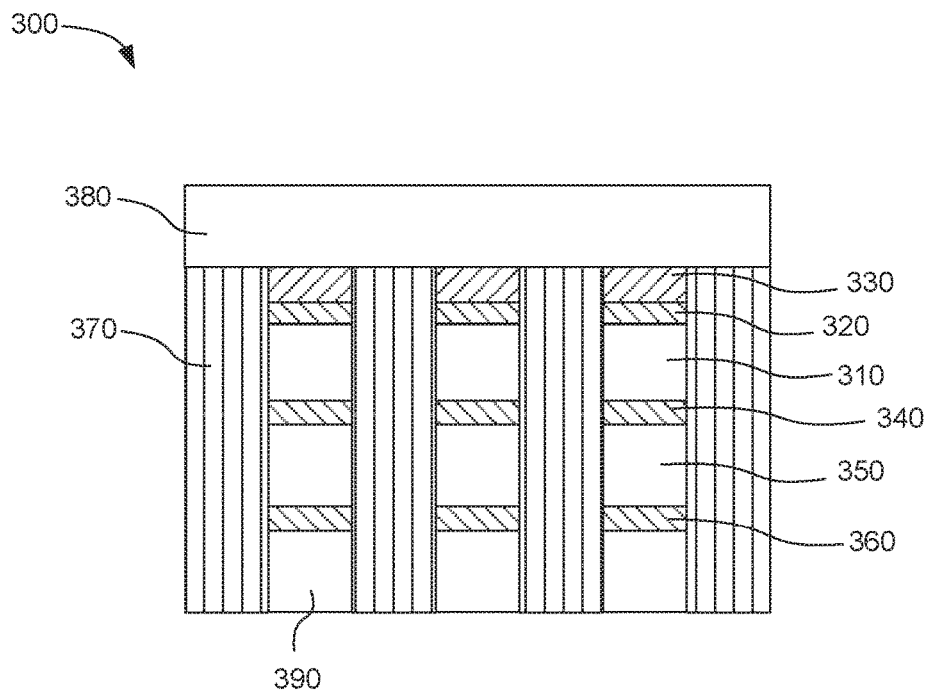
FIG. 3 is a cross-sectional view of an example memory structure device in accordance with an example embodiment.

FIG. 3 shows a cross-sectional view of an example memory structure 300. The memory structure includes a plurality of memory cells comprising a phase change material layer 310 and a first electrode layer 320 adjacent to the phase change material layer and having a phase change material layer side oriented toward the phase change material layer and a bit line side opposite the phase change material layer side. A nonconductive separator material 370 is located between the memory cells to electrically insulate the memory cells one from another. A carbon nitride layer 330 is deposited on a bit line side surface of the first electrode layers. No carbon nitride layer is present on a bit line end surface of the nonconductive separator material. A metal bit line 380 has a bottom surface that contacts the top surface of the nonconductive separator material and the carbon nitride layer.

The example shown in FIG. 3 also includes additional layers in the memory cells. A second electrode layer 340 is located adjacent the phase change material layer on a side opposite the first electrode layer. A select device material layer 350 and a third electrode layer 360 are located adjacent to the second electrode. A word line 390 is in contact with the third electrode layer on a side opposite the select device material layer.

In some examples, the metal bit line can include a conductive metal. In certain examples, the bit line can include or consist of tungsten, tantalum, niobium, molybdenum, titanium, or a combination thereof. In one particular example, the bit line can be a tungsten bit line. In further examples, the word lines can include or consist of any of these metals.

It should be noted that the figures described herein show examples of memory structures and arrays to illustrate features of the present technology, and that the present technology is not limited by the number of memory cells, size of arrays, dimensions of material layers, etc., as shown in the figures. In many practical applications, phase change memory structures and systems in accordance with the present technology can have many more memory cells than are depicted in the figures. For example, phase change memory structures and systems can have millions, billions, or more memory cells compared to the relatively small number depicted in the figures.

In some examples, bit lines can be oriented along columns of memory cells and word lines can be oriented along rows of memory cells. In many embodiments described herein, the bit lines are described as being deposited on the bit line side surface of the memory cells while the word lines are described as being at the word line side surface of the memory cells. These can also be referred to as the "top" and "bottom" sides, respectively. However, in other embodiments, the word lines can be at the top of the memory cells and the bit lines can be at the bottom of the memory cells. Additionally, because designation of "rows" and "columns" of memory cells can be arbitrary, in many cases the terms "bit line" and "word line" can be interchangeable and merely describe which electrically conductive line is oriented in the row direction and which is oriented in the column direction. Thus, embodiments that are described as having bit lines on top of the memory cells can also encompass devices having word lines on the top. Similarly, embodiments described as having word lines on the bottom of the memory cells can also encompass devices having bit lines on the bottom.

Figure 4:
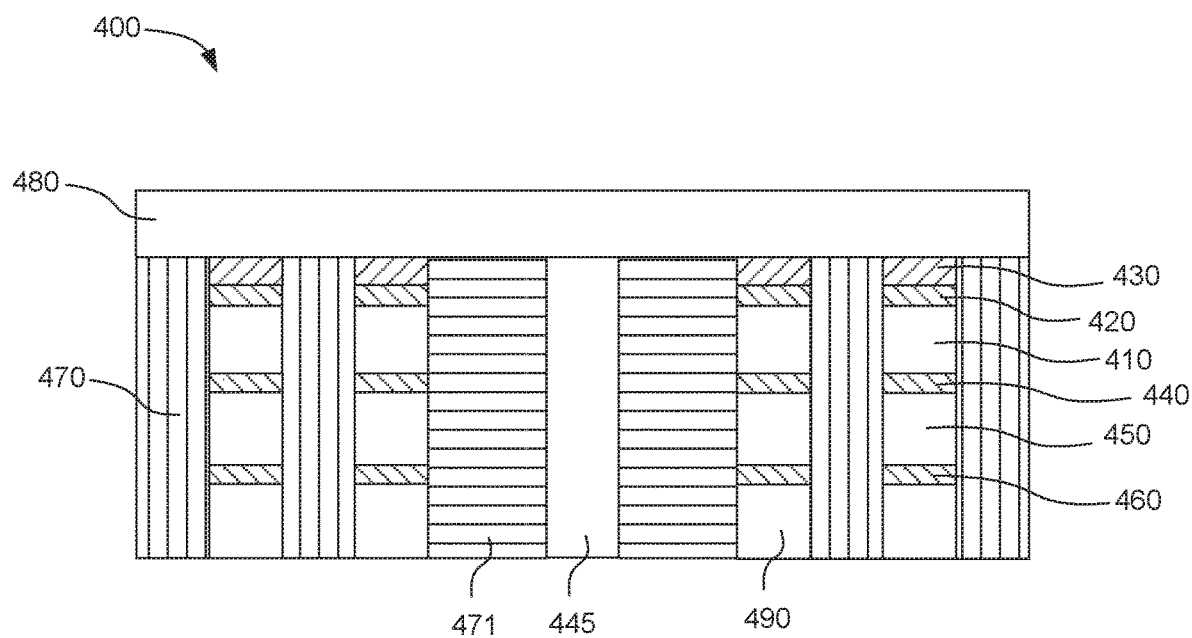
FIG. 4 is a cross-sectional view of an example memory device in accordance with an example embodiment.

FIG. 4 shows a cross-sectional view of an example memory device 400. The memory device includes a plurality of memory cells that each includes a phase change material layer 410 and a first electrode layer 420 adjacent to the phase change material layer. A carbon nitride layer 430 is deposited on a bit line side surface of the first electrode layers. The memory cells are separated one from another by a first nonconductive separator material 470. A vertical via 445 is separated from the plurality of memory cells by a second nonconductive separator material 471. The vertical via can be formed of metal. A bit line 480 can be formed of the same metal, and have a surface that contacts the carbon nitride layer and a bit line oriented surface of the vertical via. No carbon nitride layer is deposited on the top surface of the vertical via such that the bit line contacts the top surface of the vertical via by a metal-to-metal contact.

In some examples, the first nonconductive separator material 470 and the second nonconductive separator material 471 can be different materials. In a particular example, the second nonconductive separator material can be tetraethyl orthosilicate and the first nonconductive separator material can be a carbon spin on dielectric. In some cases, some dishing of the second separator material can occur during a chemical mechanical polishing operation. However, the presently disclosed process requires polishing a shorter distance than the previous process, and therefore the dishing of the second separator material can be less than in the previous process. In some examples, the second separator material can have a height variation of less than 100 Å. In further examples, the second separator material can have a height variation of less than 50 Å. As used herein, "height variation" refers to height the difference between the highest point on the top surface of the second separator material and the lowest point on the top surface of the second separator material.

The contact between the bit line and the vertical via can have reduced resistance compared to the previous process, because no metal silicon nitride layer is present between the bit line and the via. Additionally, although a carbon nitride layer is present over the first electrode layer of the memory cells, no carbon nitride layer is between the via and the bit line. If the bit line and the via are made of the same metal, then the bit line and via can become a single unitary body of the metal with low resistance. In various examples, the via can include or consist of tungsten, tantalum, niobium, molybdenum, titanium, or a combination thereof. In one particular example, the via can be a tungsten via.

The example shown in FIG. 4 also includes additional layers in the memory cells. A second electrode layer 440 is located adjacent the phase change material layer on a side opposite the first electrode layer. A select device material layer 450 and a third electrode layer 460 are located adjacent the second electrode. A word line 490 is in contact with the third electrode layer on a side opposite the select device material.

Figure 5:
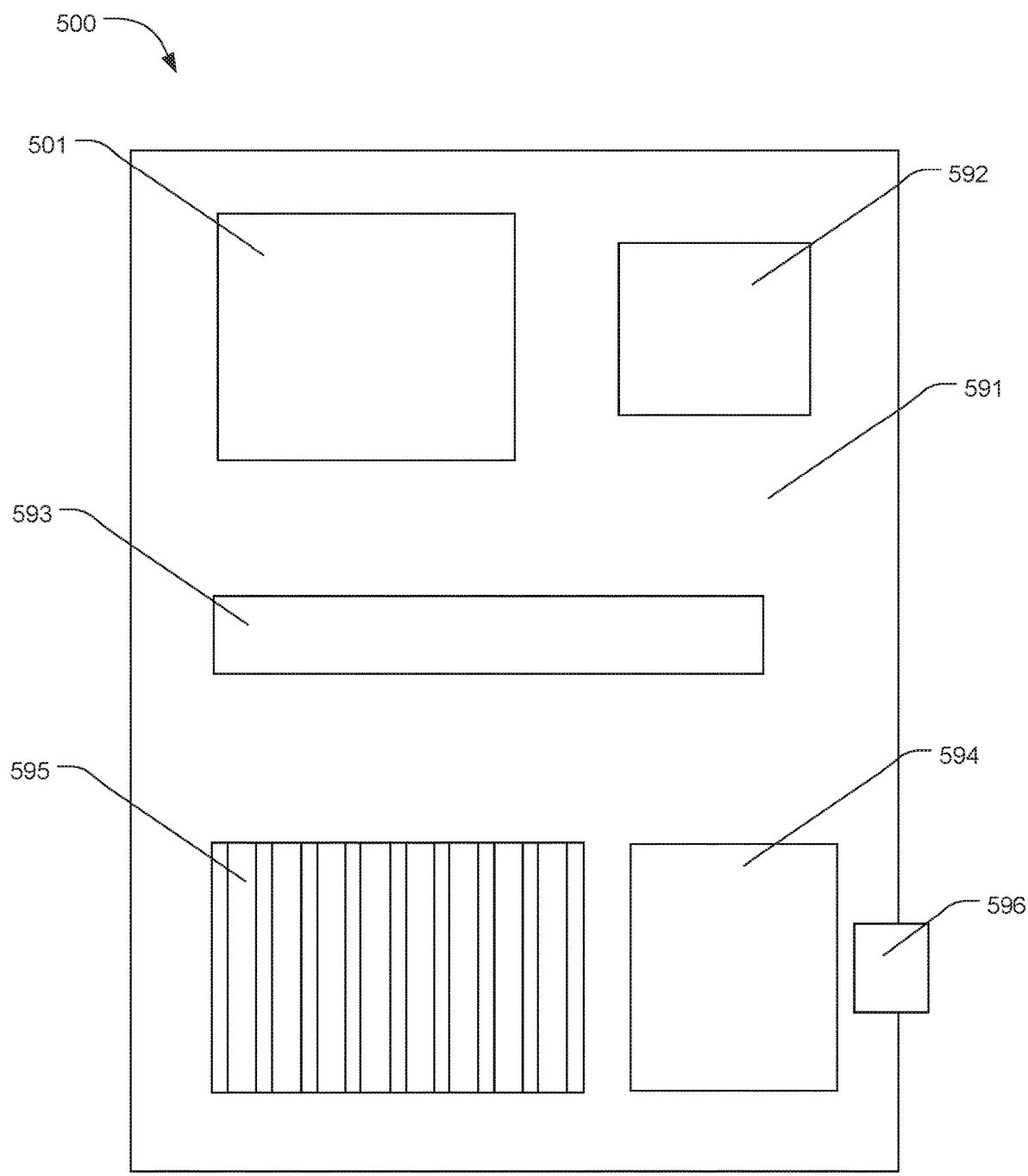
FIG. 5 is a schematic of a computing system in accordance with an example embodiment.

In some examples, a memory device as described herein can be included in a computing system. In one aspect, as illustrated in FIG. 5, a computing system 500 can include a motherboard 591 and a memory device 501 as described herein that is operably coupled to the motherboard. In some additional examples, a computing system can include a processor 592, a radio 594, a heat sink 595, a port 596, a slot 593, an additional memory device (not shown), or any other suitable device or component, which can be operably coupled to the motherboard. The computing system can comprise any type of computing system, such as a desktop computer, a laptop computer, a tablet computer, a smartphone, a wearable device, a server (e.g. a local data storage server, a cloud storage server, or the like), etc. Other embodiments need not include all of the features specified in FIG. 5, and may include alternative features not specified in FIG. 5.

Circuitry used in electronic components or devices (e.g. a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Figure 6:
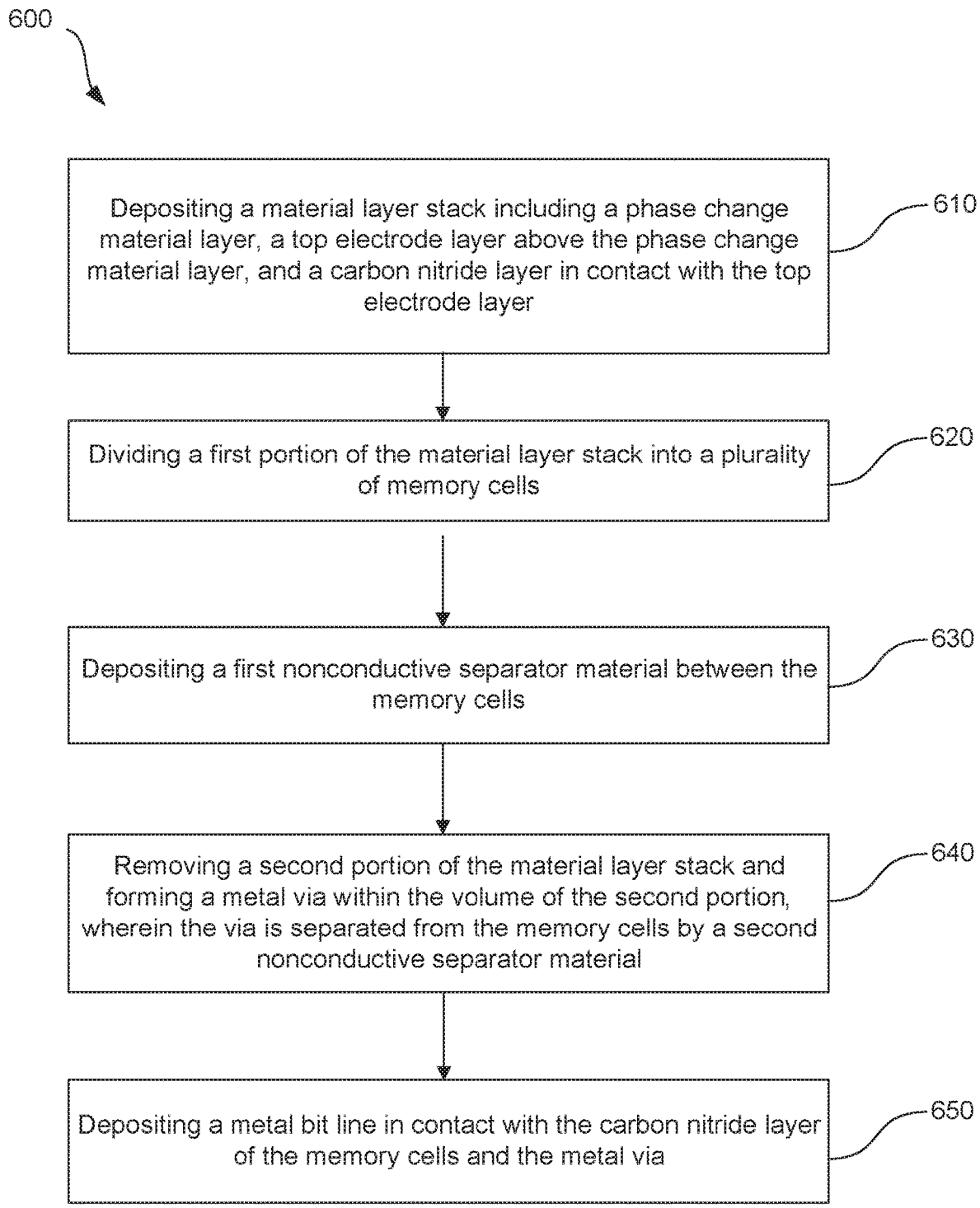
FIG. 6 is a flowchart of an example method of manufacturing a memory device in accordance with an example embodiment.

The present technology also extends to methods of making memory devices. FIG. 6 is a flow chart of an example method 600 of manufacturing a memory device. The method includes: depositing a material layer stack including a phase change material layer, a first electrode layer above the phase change material layer, and a carbon nitride layer in contact with the first electrode layer 610; dividing a first portion of the material layer stack into a plurality of memory cells 620; depositing a first nonconductive separator material between the memory cells 630; removing a second portion of the material layer stack and forming a metal via within the volume of the second portion, wherein the via is separated from the memory cells by a second nonconductive separator material 640; and depositing a metal bit line in contact with the carbon nitride layer of the memory cells and the metal via 650.

As explained above, the memory devices described herein can be made by first depositing a stack of material layers, including a carbon nitride layer at the top of the stack. The thicknesses of the layers in the material layer stack are not particularly limited. However, in some examples the carbon nitride layer can have a thickness of 10 Å to 300 Å. In further examples, the carbon nitride layer can have a thickness of 20 Å to 100 Å. In a particular example, the carbon nitride layer can be about 50 Å thick. In other examples, the first electrode layer can have a thickness of 10 Å to 500 Å. In further examples, the first electrode layer can have a thickness of 20 Å to 200 Å. In still further examples, the conductive metal bit line can have a thickness of 100 Å to 1000 Å. It should be noted that the layer thicknesses, lengths, and widths shown in the figures are not necessarily drawn to scale.

In some examples, after the material layer stack is formed, the stack can be divided into a plurality of memory cells by removing material between the cells and filling the removed volume with a nonconductive separator material. In certain examples, a via socket can be formed at the same time by removing an area of the material layer stack of a sufficient size to form a conductive via separated from the memory cells by the nonconductive separator material. After removing the area of the material layer stack for the via socket and filling the via socket with nonconductive separator material, the via itself can be formed by removing a portion of the nonconductive separator material in the via socket and then filling the removed area with a conductive metal. In a particular example, the via can be a tungsten via. Tungsten can be filled into the removed portion of the nonconductive separator material in the via socket. A tungsten bit line can then be formed over the top surface of the layer stack, so that the bit line connects the via with the memory cells. Specifically, the bit line can be in contact with the via and with the carbon nitride layers of the memory cells.

In further examples, the via socket may be formed before the memory cells. For example, a material layer stack can be formed and then a portion of the layers can be removed to make space for a via socket. The memory cells can then be divided in a subsequent step. In some cases, the via socket can be filled with a nonconductive separator material, and then the memory cells can be divided and the spaces between the memory cells can be filled with an additional nonconductive separator material. In further examples, the metal via can be deposited in the via socket either before or after the memory cells have been divided.

In various examples, removal of portions of the layer stack to form the via socket and to divide the memory cells can be accomplished by depositing a mask layer. In certain examples, a nitride hard mask layer can be used. This layer can be patterned to allow etching certain areas of the layer stack while areas covered by the mask remain unetched. After such an etching step, the mask layer can be removed by a polishing operation. Additionally, in some examples depositing the nonconductive separator materials and the metal via can involve depositing a layer of the nonconductive separator material or metal across the entire layer stack. The extraneous material can then be removed by a polishing operation.

In a particular example, the via socket can be formed by removing a portion of the layers and filling the removed volume with a nonconductive separator material. A nitride layer can then be deposited over the metal layer and the nonconductive separator material of the via socket before dividing the material layers into the plurality of memory cells. The individual memory cells can then be formed by etching portions of the layers and filling in the etched volumes with an additional nonconductive separator material. In further examples, a nitride cap layer can be deposited after dividing the material layers into the plurality of memory cells. The metal via can then be formed by etching an area of the nonconductive separator material in the via socket and then filling the etched volume with metal. The method can also include removing the nitride layers using a polishing operation adapted to stop on the carbon nitride layer of the memory cells. The metal bit line can then be deposited so that the bit line contacts the carbon nitride layers of the memory cells and the metal via. The bit line can contact the via by a metal-to-metal contact.

Examples

The following examples pertain to specific embodiments and point out specific features, elements, or steps that can be used or otherwise combined in achieving such embodiments.

Figure 7A:
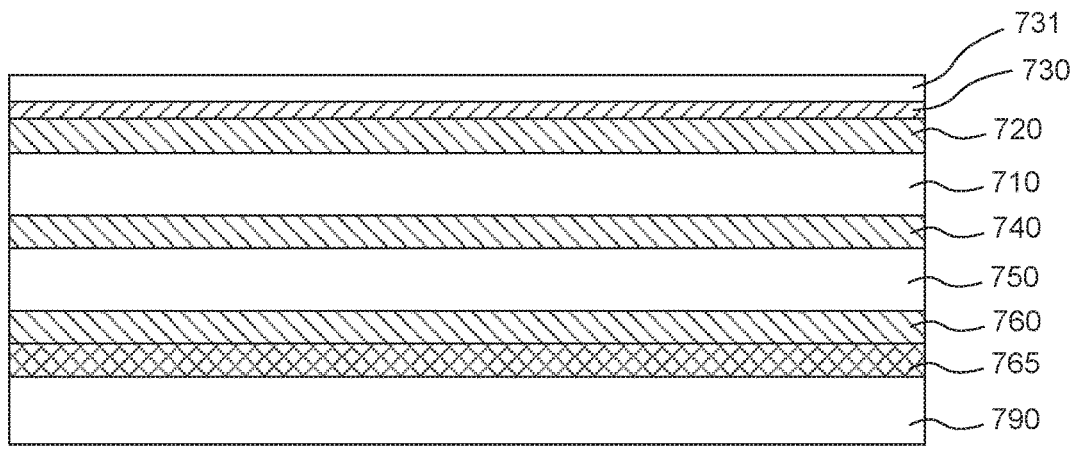
FIGS. 7A-7F are cross-sectional views of steps in a method of manufacturing a memory device in accordance with an example embodiment.

FIGS. 7A through 7F show cross-sectional views of multiple steps in a method of manufacturing a memory device in accordance with the present technology. In FIG. 7A, continuous layers of several materials are deposited. From bottom to top, the layers include: a tungsten word line 790, a thermal barrier layer 765, a third electrode 760, a select device material layer 750, a second electrode layer 740, a phase change material layer 710, a first electrode layer 720, a carbon nitride layer 730, and a nitride hard mask layer 731. In this particular example, the thermal barrier layer can be made of a metal silicon nitride material.

Figure 7B:
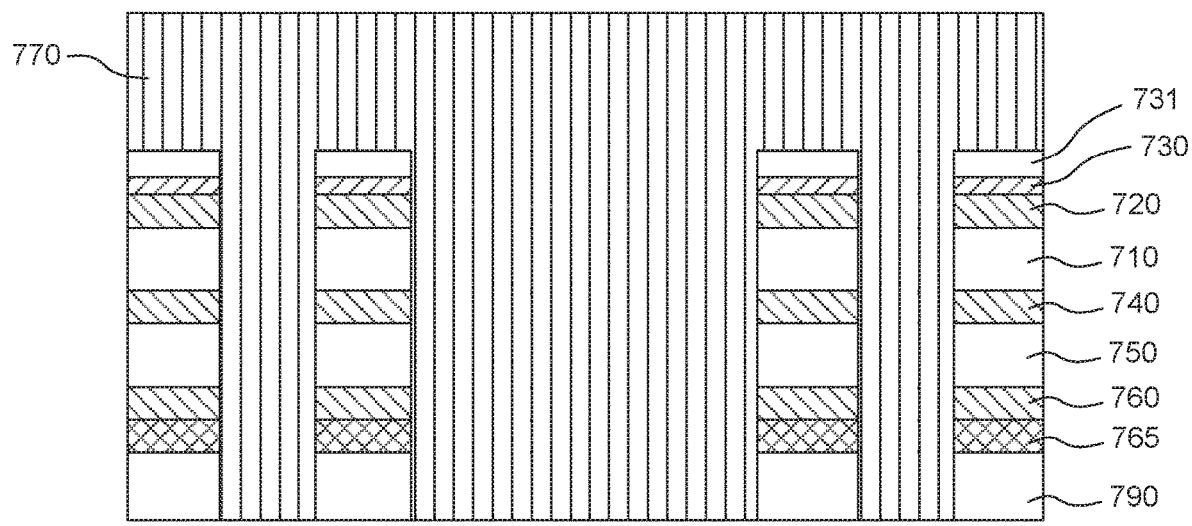

In FIG. 7B, the memory cells have been divided by etching and a larger area of the layer stack has been removed to form a via socket. The removed portions of the layer stack have been filled in with a carbon spin on dielectric material 770.

Figure 7C:
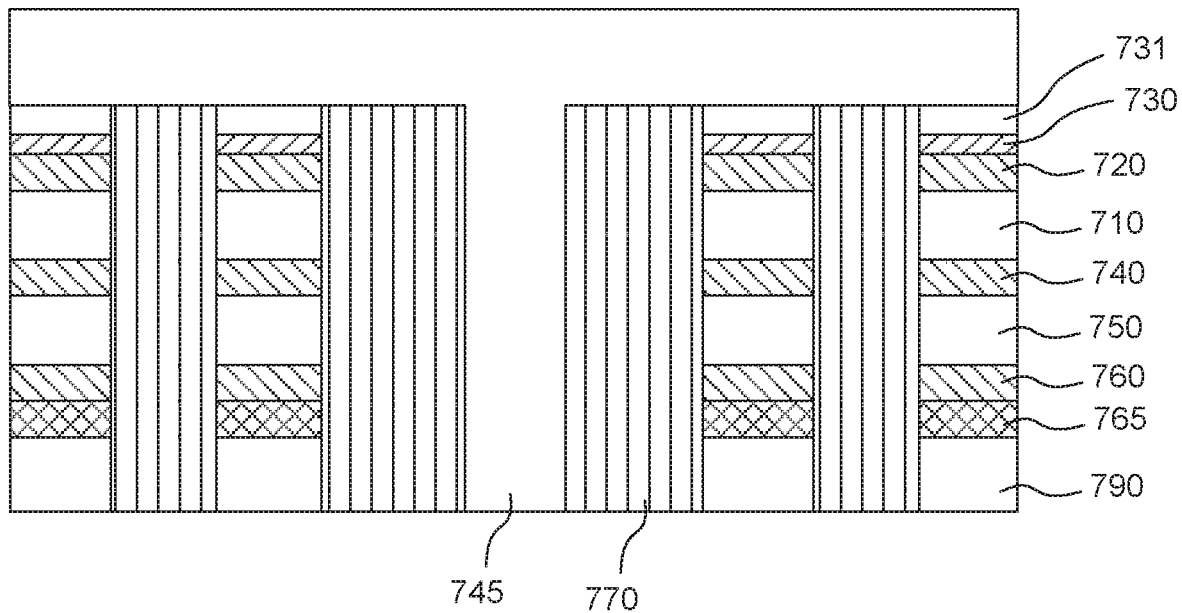

In FIG. 7C, the extraneous carbon spin on dielectric material on the top surface of the layer stack has been removed by a chemical mechanical polishing operation. A portion of the dielectric material in the via socket has been remove and the removed portion has been filled in with tungsten to form a tungsten via 745.

Figure 7D:
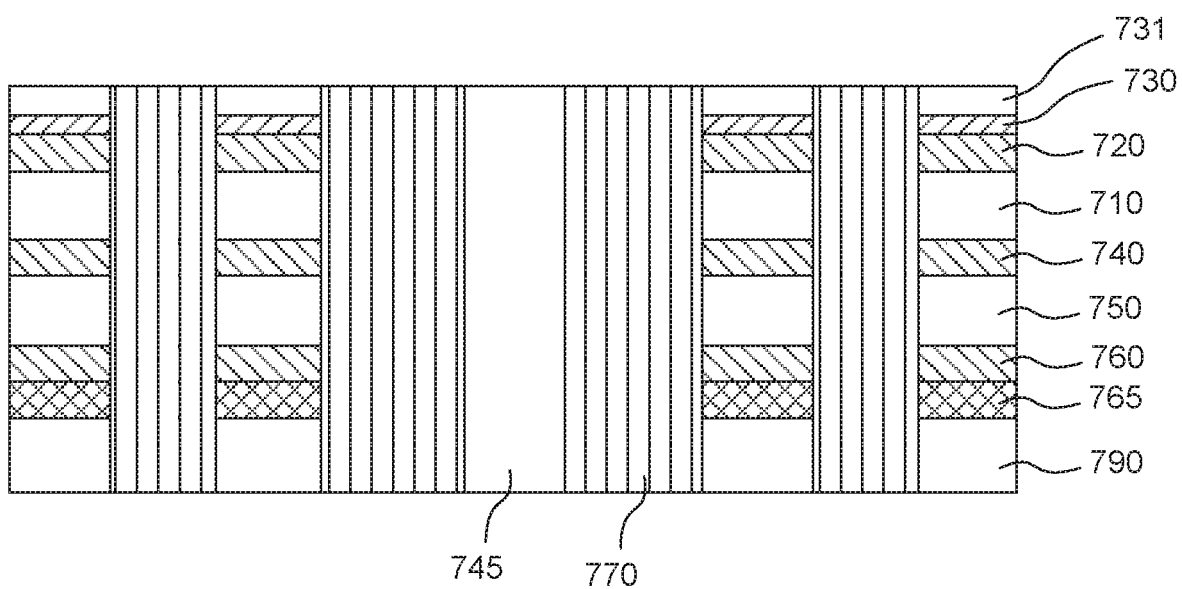

In FIG. 7D, extraneous tungsten has been removed from the top surface of the layer stack by a chemical mechanical polishing operation designed to stop on the nitride hard mask layer 731.

Figure 7E:
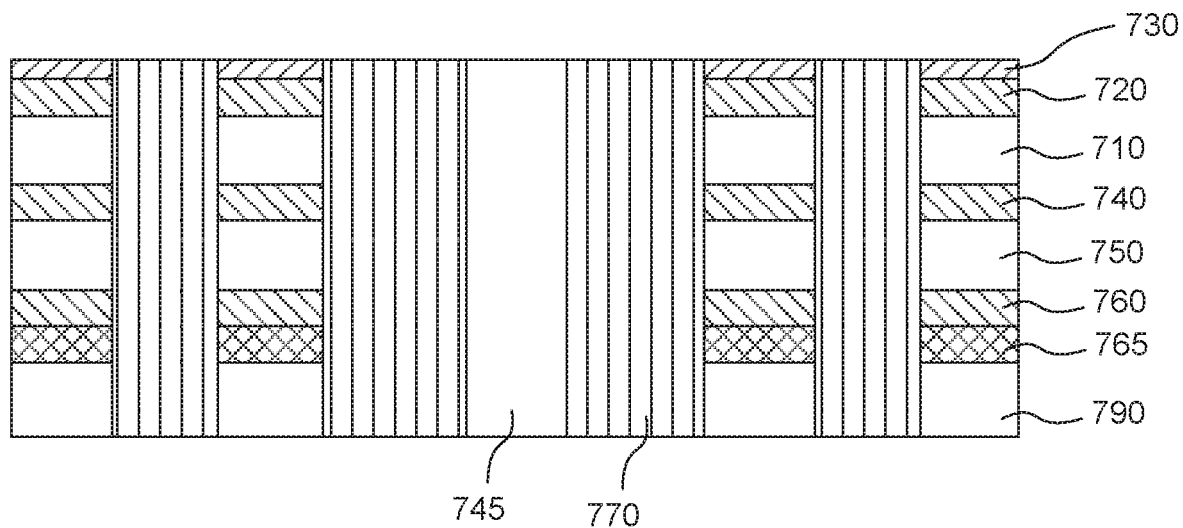

In FIG. 7E, the nitride hard mask layer 731 has been removed by a chemical mechanical polishing operation designed to stop on the carbon nitride layer 730 of the memory cells.

Figure 7F:
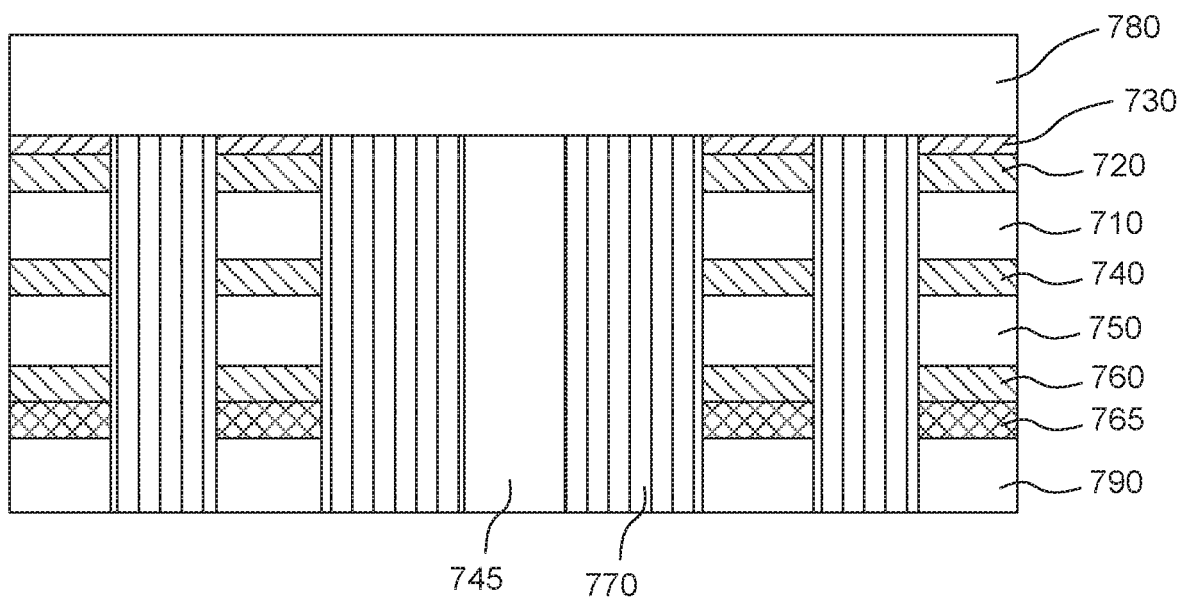

Finally, in FIG. 7F, a tungsten bit line 780 is deposited so that the tungsten bit line contacts the carbon nitride layers of the memory cells and the tungsten via. The tungsten bit line contacts the tungsten via by a metal to metal contact.

Figure 8A:
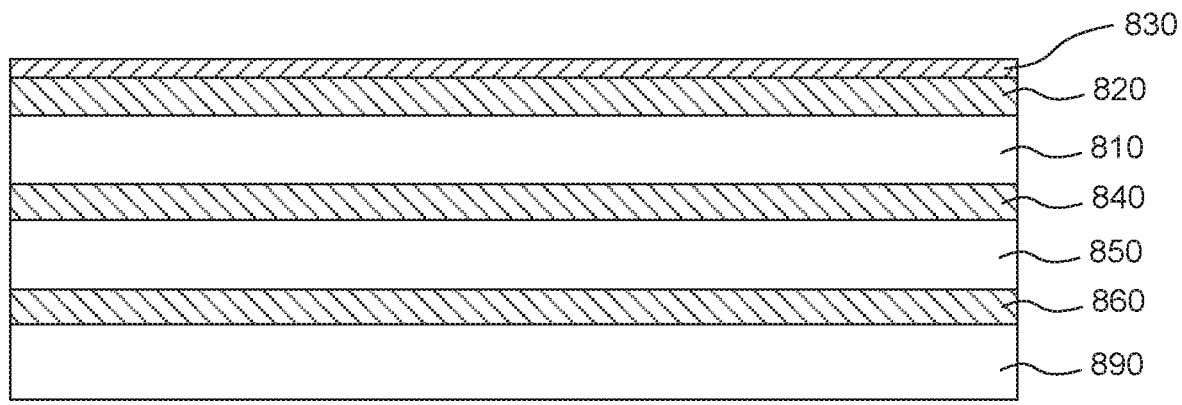
FIGS. 8A-8I are cross-sectional views of steps in another example method of manufacturing a memory device in accordance with an example embodiment.

An alternate method of manufacturing a memory device in accordance with the present technology is shown in FIGS. 8A through 8I. FIG. 8A shows a layer stack formed by depositing continuous layers of several materials. From bottom to top, the layers include: a tungsten word line 890, a third electrode layer 860, a select device material layer 850, a second electrode layer 840, a phase change material layer 810, a first electrode material layer 820, and a carbon nitride layer 830. The electrode layers are carbon-containing electrode materials.

Figure 8B:
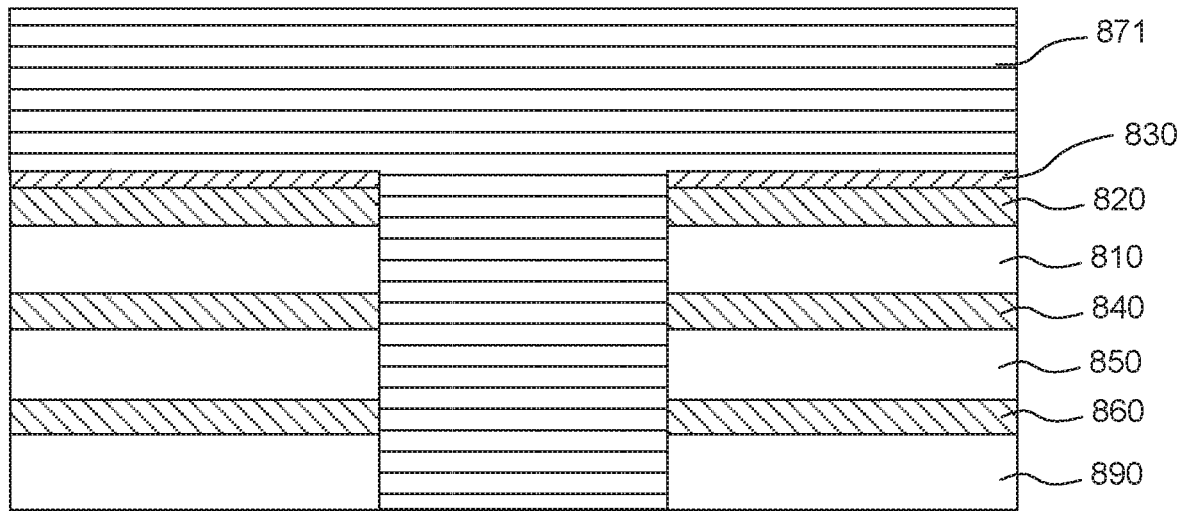

In FIG. 8B, a portion of the layers has been removed and filled with a nonconductive separator material 871 to form a via socket. The nonconductive separator material in this example is tetraethyl orthosilicate (TEOS).

Figure 8C:
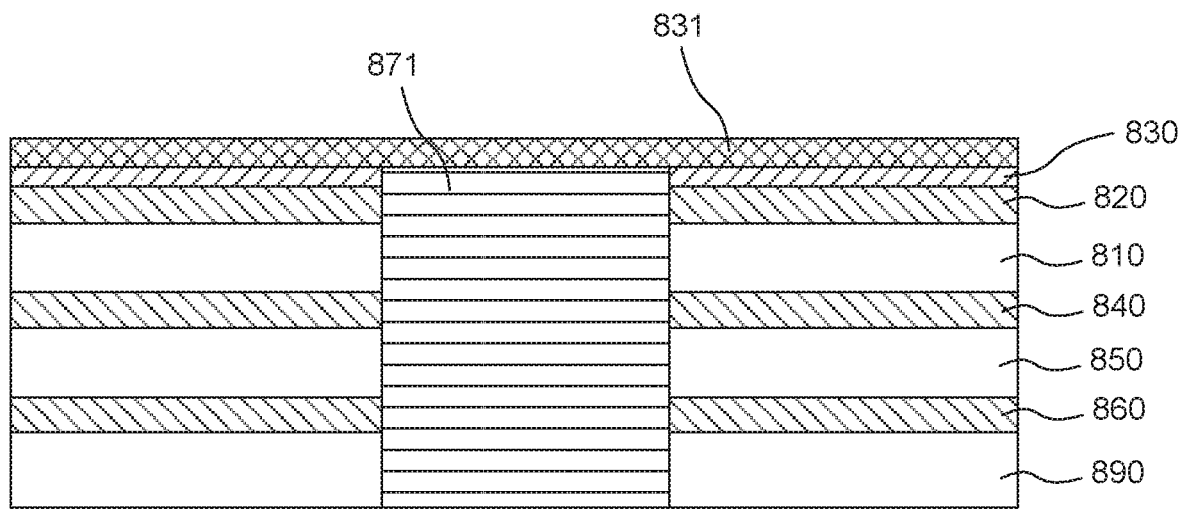

In FIG. 8C, a polishing operation has been used to remove excess TEOS 871 from the top of the stack and a nitride hard mask layer 831 has been deposited over the top of the carbon nitride layer 830 and the TEOS in the via socket.

Figure 8D:
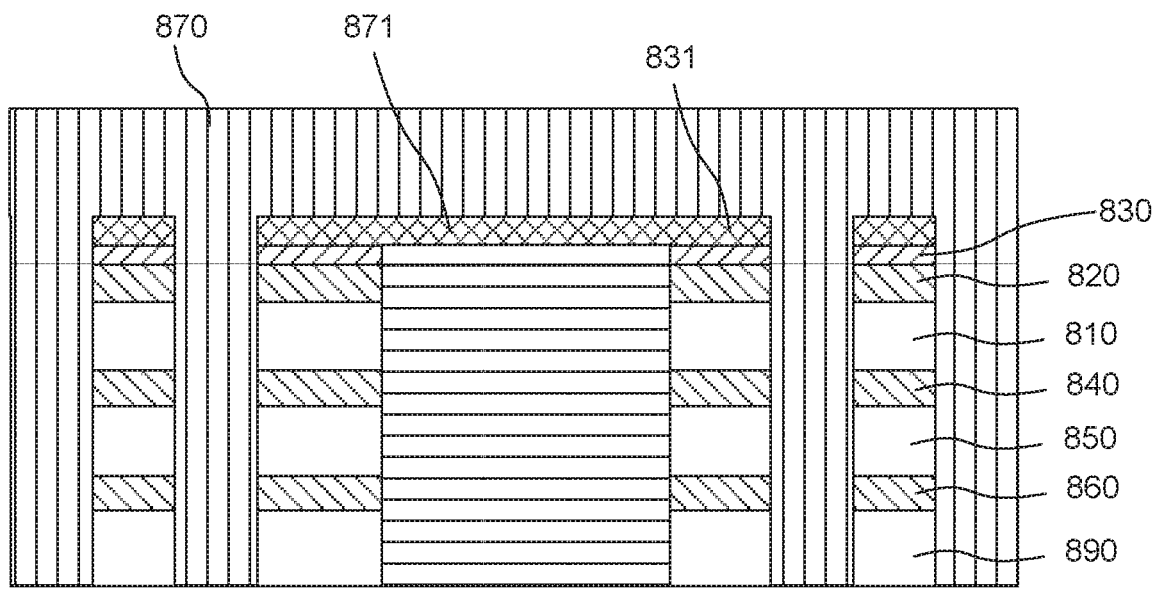

In FIG. 8D, the layers have been divided into multiple memory cells by etching areas of the stack between the memory cells to remove the layer materials and then filling the etched area with an additional nonconductive separator material 870. In this example, the additional nonconductive separator material is a carbon spin on dielectric.

Figure 8E:
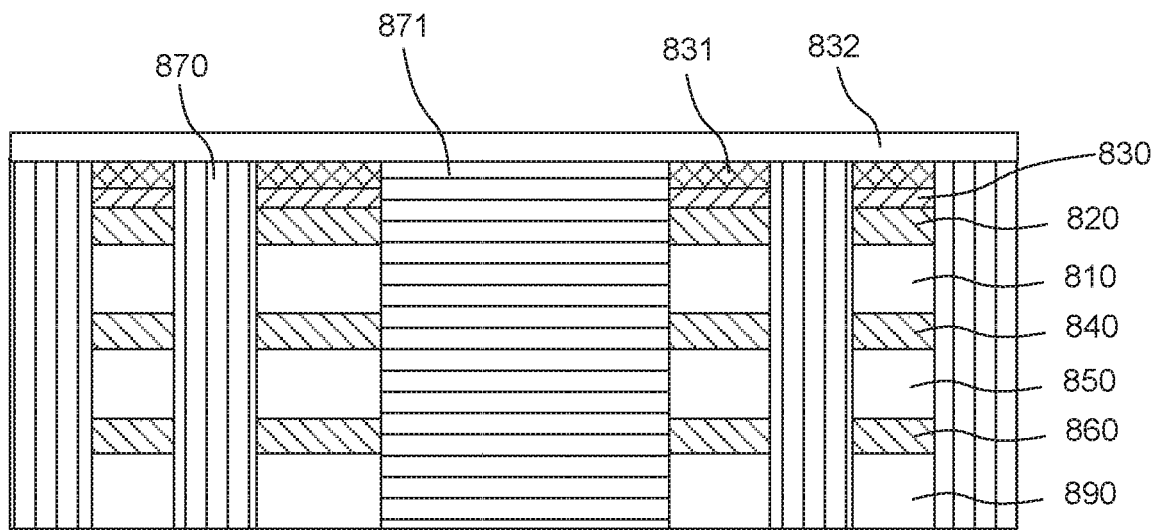

In FIG. 8E, excess carbon spin on dielectric material has been removed by a polishing operation and a nitride cap 832 has been deposited over the layer stack.

Figure 8F:
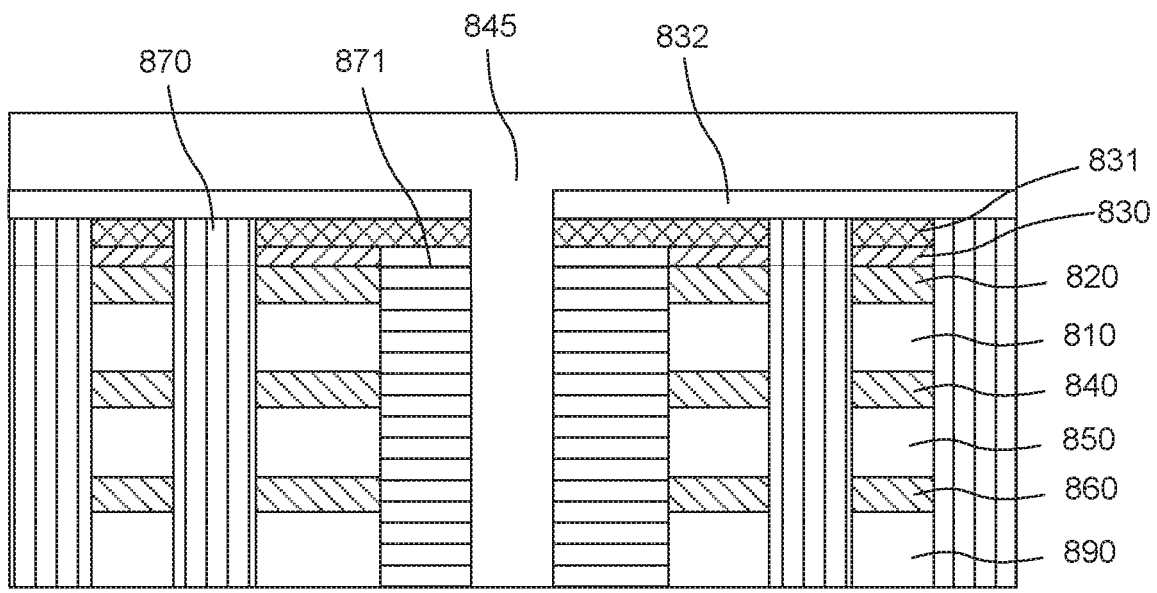

In FIG. 8F, an area of the TEOS 871 is etched and filled with tungsten to form a tungsten via 845.

Figure 8G:
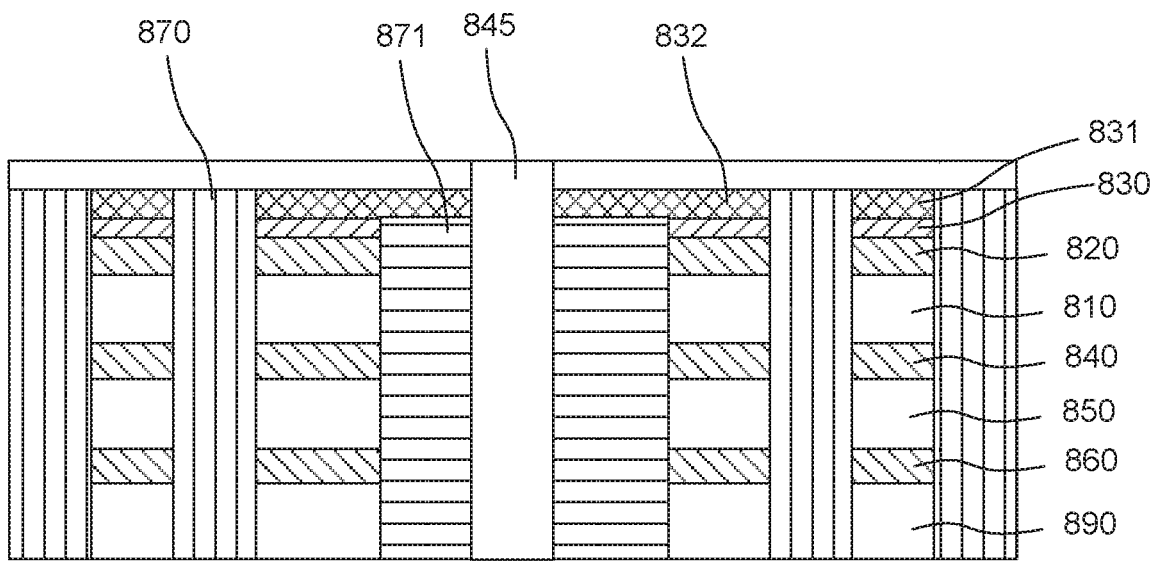

In FIG. 8G, the top portion of the tungsten is polished away by a chemical mechanical polishing operation designed to stop on the nitride cap 832.

Figure 8H:
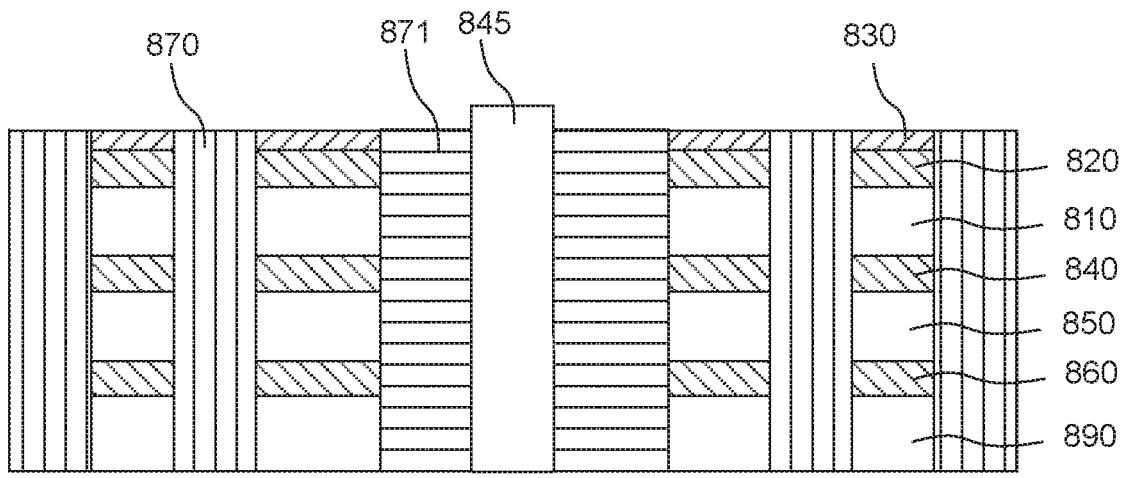

In FIG. 8H, the nitride cap 832 is removed by a chemical mechanical polishing operation designed to stop on the carbon nitride layers 830 at the tops of the memory cells.

Figure 8I:
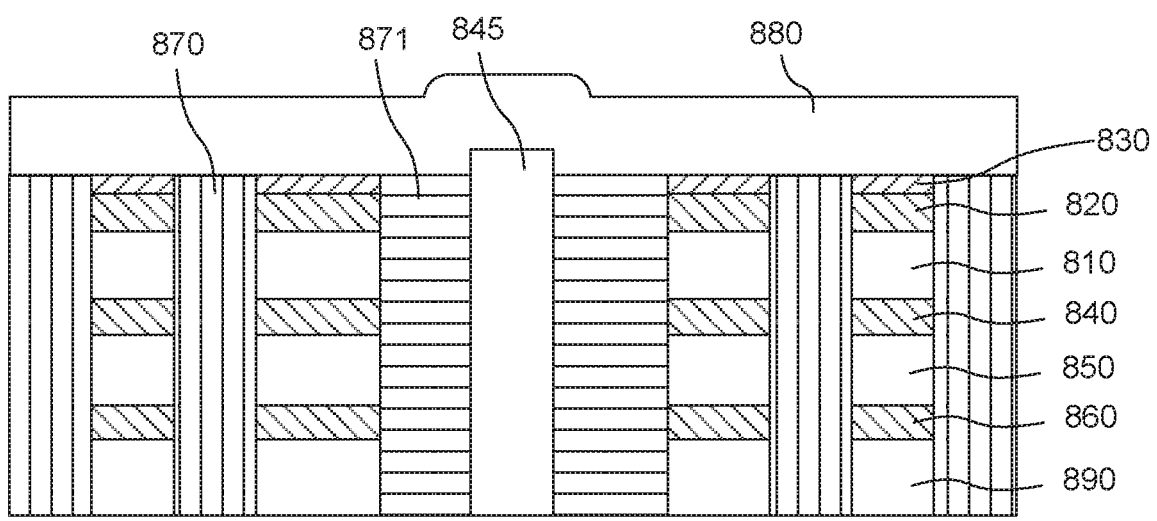

In FIG. 8I, additional tungsten is deposited to form a tungsten bit line 880. As described above, tungsten bit line contacts the carbon nitride layers of the memory cells and the tungsten via. The tungsten bit line contacts the tungsten via by a metal to metal contact.

In an exemplary embodiment of the present technology, a memory cell includes a phase change material layer, a first electrode layer adjacent to the phase change material layer and having a phase change material layer side oriented toward the phase change material layer and a bit line side opposite the phase change material layer side, and a carbon nitride layer on a surface of the bit line side of the first electrode layer.

In another example, the memory cell is substantially free of metal silicon nitride.

In a further example, the carbon nitride layer comprises from about 23 at. % to about 40 at. % nitrogen.

In yet another example, the carbon nitride layer has a resistivity at 20° C. from about 0.1 ohm-cm to about 2 ohm-cm.

In still another example, the carbon nitride layer has a density from about 2 g/cm$^3$ to about 3 g/cm$^3$.

In yet another example, the carbon nitride layer has a thermal conductivity from about 0.2 W/m·K to about 2 W/m·K.

In another example, the carbon nitride layer has a thickness from about 10 Å to about 300 Å.

In an additional example, the memory cell also comprises a nonconductive separator material having a word line end and a bit line end, and a portion contacting the phase change material layer, wherein a bit line end surface of the nonconductive separator material is at least partially free of contact with the carbon nitride layer.

In another example, a bit line side surface of the carbon nitride layer is substantially coplanar with the bit line end surface of the nonconductive separator material.

In certain examples, the nonconductive separator material comprises a spin on dielectric material.

In a further example, the memory cell also comprises a second electrode layer adjacent the phase change material layer on a side opposite the first electrode layer, a select device layer adjacent the second electrode layer on a side opposite the phase change material layer, and a third electrode layer adjacent the select device layer on a side opposite the second electrode layer.

In another example, the first electrode layer comprises a carbon-containing material.

In yet another example, the bit line side surface of the first electrode is substantially flat.

In still another example, the phase change material layer comprises a chalcogenide.

Another exemplary embodiment of the present technology includes a memory device. The memory device comprises a plurality of memory cells, a first nonconductive separator material separating the memory cells, a metal via separated from the memory cells by a second nonconductive separator material, and a metal bit line electrically connecting the metal via with the plurality of memory cells. The memory cells comprise a phase change material layer, a first electrode layer adjacent to the phase change material layer and having a phase change material layer side oriented toward the phase change material layer and a bit line side opposite the phase change material layer side, and a carbon nitride on a surface of the bit line side of the first electrode layer. The first nonconductive separator material has a word line end and a bit line end, and the bit line end surface is at least partially free of contact with the carbon nitride layer.

In some examples, the metal bit line comprises tungsten, tantalum, niobium, molybdenum, titanium, or a combination thereof.

In further examples, the metal via comprises tungsten, tantalum, niobium, molybdenum, titanium, or a combination thereof.

In a certain example, the metal bit line and the metal via comprise substantially the same material.

In another example, no carbon nitride layer is present on a bit line end surface of the metal via, such that the metal bit line contacts the metal via by a metal to metal contact.

In a further example, the memory cells are substantially free of metal silicon nitride.

In yet another example, the carbon nitride layer comprises from about 23 at. % to about 40 at. % nitrogen.

In still another example, the carbon nitride layer has a resistivity at 20° C. from about 0.1 ohm-cm to about 2 ohm-cm.

In another example, the carbon nitride layer has a density from about 2 g/cm$^3$ to about 3 g/cm$^3$.

In yet another example, the carbon nitride layer has a thermal conductivity from about 0.2 W/m·K to about 2 W/m·K.

In still another example, the carbon nitride layer has a thickness from about 10 Å to about 300 Å.

In a further example, a bit line side surface of the carbon nitride layer is substantially coplanar with a bit line end surface of the first nonconductive separator material.

In certain examples, the first nonconductive separator material comprises a spin on dielectric material.

In another example, the second nonconductive separator material is tetraethyl orthosilicate (TEOS) or is formed from tetraethyl orthosilicate.

In a particular example, the first nonconductive separator material and the second nonconductive separator material are the same material.

In a further example, the memory cells further comprise a second electrode layer adjacent the phase change material layer on a side opposite the first electrode layer, a select device layer adjacent the second electrode layer on a side opposite the phase change material layer, and a third electrode layer adjacent the select device layer on a side opposite the second electrode layer.

In another example, the first electrode layer comprises a carbon-containing material.

In yet another example, the bit line side surface of the first electrode is substantially flat.

In still another example, the phase change material layer comprises a chalcogenide.

Another exemplary embodiment of the present technology includes a computing system. The computing system comprises a motherboard and the memory device operatively coupled to the motherboard.

In certain examples, the computing system comprises a desktop computer, a laptop computer, a tablet, a smartphone, a wearable device, a server, or a combination thereof.

In further examples, the computing system further comprises a processor, a memory device, a heat sink, a radio, a slot, a port, or a combination thereof operably coupled to the motherboard.

Another exemplary embodiment of the present technology includes a method of manufacturing a memory device. The method comprises depositing a material layer stack including a phase change material layer, a first electrode layer on the phase change material layer, and a carbon nitride layer in contact with the first electrode layer. A first portion of the material layer stack is divided into a plurality of memory cells. A first nonconductive separator material is then deposited between the memory cells. A second portion of the material layer stack is removed and a metal via is formed within the volume of the second portion, wherein the via is separated from the memory cells by a second nonconductive separator material. A metal bit line is deposited in contact with the carbon nitride layer of the memory cells and the metal via.

In another example, depositing the material stack further includes depositing a third electrode layer, a select device layer over the third electrode layer and a second electrode layer over the select device before depositing the phase change material layer over the second electrode layer.

In a further example, dividing the first portion of the material layer stack into the plurality of memory cells comprises applying a nitride mask layer over the material layer stack, and etching an area of the first portion of the material layer stack to form the plurality of memory cells.

In a still further example, the nitride mask layer is removed using a chemical mechanical polishing operation that stops on a bit line side surface of the carbon nitride layer of the memory cells leaving a bit line end surface of the first nonconductive separator material coplanar with the bit line side surface of the carbon nitride layer.

In some examples, the metal bit line comprises tungsten, tantalum, niobium, molybdenum, titanium, or a combination thereof.

In further examples, the metal via comprises tungsten, tantalum, niobium, molybdenum, titanium, or a combination thereof.

In a particular example, the metal bit line and the metal via comprise substantially the same material.

In yet another example, no carbon nitride layer is present on a bit line end surface of the metal via, such that the metal bit line contacts the metal via by a metal to metal contact.

In still another example, the memory cells are substantially free of metal silicon nitride.

In another example, the carbon nitride layer comprises from about 23 at. % to about 40 at. % nitrogen.

In yet another example, the carbon nitride layer has a resistivity at 20° C. from about 0.1 ohm-cm to about 2 ohm-cm.

In still another example, the carbon nitride layer has a density from about 2 g/cm$^3$ to about 3 g/cm$^3$.

In another example, the carbon nitride layer has a thermal conductivity from about 0.2 W/m·K to about 2 W/m·K.

In a further example, the carbon nitride layer has a thickness from about 10 Å to about 300 Å.

In some examples, the first nonconductive separator material comprises a spin on dielectric material.

In another example, the second nonconductive separator material is tetraethyl orthosilicate (TEOS) or is formed from tetraethyl orthosilicate.

In a particular example, the first nonconductive separator material and the second nonconductive separator material are the same material.

In yet another example, the first electrode layer comprises a carbon-containing material.

In a further example, the phase change material layer comprises a chalcogenide.

While the forgoing examples are illustrative of the principles of technology embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device, comprising:
  a plurality of memory cells, individual ones of the plurality of memory cells each comprising a phase change material layer, a first electrode layer adjacent to the phase change material layer and having a phase change material layer side oriented toward and in physical contact with the phase change material layer and a bit line side opposite the phase change material layer side, and a carbon nitride layer on a surface of and in physical contact with the bit line side of the first electrode layer;
  a first nonconductive separator material separating the plurality of memory cells and having a word line end and a bit line end, wherein a bit line end surface of the first nonconductive separator material is at least partially free of contact with the carbon nitride layer;
  a metal via separated from the plurality of memory cells by a second nonconductive separator material; and
  a metal bit line electrically connecting the metal via with the plurality of memory cells, wherein the metal bit line is in physical contact with the carbon nitride layer, and wherein the carbon nitride layer is made of a material different from a material of the first electrode layer.

2. The memory device of claim 1, wherein the metal bit line comprises tungsten, tantalum, niobium, molybdenum, titanium, or a combination thereof.

3. The memory device of claim 1, wherein the metal via comprises tungsten, tantalum, niobium, molybdenum, titanium, or a combination thereof.

4. The memory device of claim 1, wherein the metal bit line and the metal via comprise substantially the same material.

5. The memory device of claim 1, wherein no carbon nitride layer is present on a bit line end surface of the metal via, such that the metal bit line contacts the metal via by a metal to metal contact.

6. The memory device of claim 1, wherein the plurality of memory cells are substantially free of metal silicon nitride.

7. The memory device of claim 1, wherein the carbon nitride layer comprises from about 23 at. % to about 40 at. % nitrogen.

8. The memory device of claim 1, wherein the carbon nitride layer has a resistivity at 20° C. from about 0.1 ohm-cm to about 2 ohm-cm.

9. The memory device of claim 1, wherein the carbon nitride layer has a density from about 2 g/cm$^3$ to about 3 g/cm$^3$.

10. The memory device of claim 1, wherein the carbon nitride layer has a thermal conductivity from about 0.2 W/m·K to about 2 W/m·K.

11. The memory device of claim 1, wherein a bit line side surface of the carbon nitride layer is substantially coplanar with the bit line end surface of the first nonconductive separator material.

12. The memory device of claim 1, wherein the first nonconductive separator material comprises a spin on dielectric material.

13. The memory device of claim 1, wherein the second nonconductive separator material is tetraethyl orthosilicate (TEOS) or is formed from tetraethyl orthosilicate.

14. The memory device of claim 1, wherein the first nonconductive separator material and the second nonconductive separator material are the same material.

15. The memory device of claim 1, wherein the plurality of memory cells further comprise a second electrode layer adjacent the phase change material layer on a side opposite the first electrode layer, a select device layer adjacent the second electrode layer on a side opposite the phase change material layer, and a third electrode layer adjacent the select device layer on a side opposite the second electrode layer.

16. The memory device of claim 1, wherein the first electrode layer comprises a carbon-containing material.

17. The memory device of claim 16, wherein the bit line side surface of the first electrode is substantially flat.

18. The memory device of claim 1, wherein the phase change material layer comprises a chalcogenide.

* * * * *